(12) United States Patent
Liu et al.

(10) Patent No.: US 10,573,640 B2
(45) Date of Patent: Feb. 25, 2020

(54) ELECTRO-STATIC DISCHARGE ASSEMBLY WITH SEMICONDUCTOR LAYER, ARRAY SUBSTRATE AND FABRICATION METHOD THEREOF, AND DISPLAY PANEL

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Chen Ting Liu, Beijing (CN); Xiaodong Pan, Beijing (CN); Zhiming Hu, Beijing (CN); Chunxiang Nan, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/566,145

(22) PCT Filed: May 5, 2017

(86) PCT No.: PCT/CN2017/083204
§ 371 (c)(1),
(2) Date: Oct. 12, 2017

(87) PCT Pub. No.: WO2017/198077
PCT Pub. Date: Nov. 23, 2017

(65) Prior Publication Data
US 2018/0204830 A1   Jul. 19, 2018

(30) Foreign Application Priority Data
May 16, 2016 (CN) .......................... 2016 1 0321379

(51) Int. Cl.
H01L 29/786 (2006.01)
H01L 27/02 (2006.01)
(Continued)

(52) U.S. Cl.
CPC .... H01L 27/0292 (2013.01); G02F 1/136204 (2013.01); H01L 27/0288 (2013.01);
(Continued)

(58) Field of Classification Search
CPC .......... G02F 1/136204; H01L 27/0292; H01L 27/0296; H01L 29/78633
See application file for complete search history.

(56) References Cited

U.S. PATENT DOCUMENTS

2008/0174238 A1\* 7/2008 Jeong .................. H01L 27/3276
313/504
2010/0157501 A1 6/2010 Asakura et al.
(Continued)

FOREIGN PATENT DOCUMENTS

CN   101226954 A   7/2008
CN   103928456 A   7/2014
(Continued)

OTHER PUBLICATIONS

International Search Report and Written Opinion dated Jul. 14, 2017; PCT/CN2017/083204.

Primary Examiner — Shaun M Campbell
Assistant Examiner — Suberr L Chi
(74) Attorney, Agent, or Firm — Ladas & Parry LLP; Hermine Valizadeh

(57) ABSTRACT

An electro-static discharge assembly, an array substrate and a fabrication method thereof, and a display panel are provided. The electro-static discharge assembly includes: a base substrate; a semiconductor layer, a first insulating layer, a first auxiliary electrode, a first electrode and a second
(Continued)

electrode provided on the base substrate, wherein the first electrode and the second electrode are spaced apart from each other and are respectively in contact with the semiconductor layer, the first auxiliary electrode is in contact with one of the first electrode and the second electrode, and the first insulating layer is provided between the first auxiliary electrode and both the first electrode and the second electrode.

20 Claims, 4 Drawing Sheets

(51) Int. Cl.
*H01L 27/12* (2006.01)
*G02F 1/1362* (2006.01)
*H01L 29/06* (2006.01)
*H01L 29/66* (2006.01)
*G02F 1/1368* (2006.01)
*G02F 1/1333* (2006.01)
*H01L 27/32* (2006.01)

(52) U.S. Cl.
CPC ........ *H01L 27/0296* (2013.01); *H01L 27/124* (2013.01); *H01L 27/1222* (2013.01); *H01L 27/1244* (2013.01); *H01L 27/1262* (2013.01); *H01L 29/0649* (2013.01); *H01L 29/66765* (2013.01); *H01L 29/78633* (2013.01); *H01L 29/78678* (2013.01); *G02F 1/1368* (2013.01); *G02F 1/136209* (2013.01); *G02F 1/136286* (2013.01); *G02F 2001/133388* (2013.01); *G02F 2001/136295* (2013.01); *G02F 2202/104* (2013.01); *H01L 27/3248* (2013.01); *H01L 27/3262* (2013.01); *H01L 27/3272* (2013.01); *H01L 27/3276* (2013.01); *H01L 2227/323* (2013.01)

(56) References Cited

U.S. PATENT DOCUMENTS

| 2014/0367581 | A1* | 12/2014 | Fujimura | H01L 27/14612 250/394 |
| 2015/0187750 | A1* | 7/2015 | Kim | H01L 27/0248 257/43 |
| 2015/0212366 | A1* | 7/2015 | Lou | G02F 1/133512 349/106 |
| 2015/0370109 | A1* | 12/2015 | Cao | H01L 27/124 257/347 |
| 2017/0031218 | A1* | 2/2017 | Li | G02F 1/136204 |

FOREIGN PATENT DOCUMENTS

| CN | 105810677 A | 7/2016 | |
| EP | 3086170 A1 * | 10/2016 | ....... G02F 1/133345 |

\* cited by examiner

ELECTRO-STATIC DISCHARGE ASSEMBLY WITH SEMICONDUCTOR LAYER, ARRAY SUBSTRATE AND FABRICATION METHOD THEREOF, AND DISPLAY PANEL

TECHNICAL FIELD

The present disclosure relates to an electro-static discharge assembly, an array substrate and a fabrication method thereof, and a display panel.

BACKGROUND

A thin film transistor liquid crystal display and an active organic light-emitting diode display both include an array substrate, and the array substrate is provided thereon with a large number of data lines and gate lines. However, at an overlapping position of the gate line and the data line, release of a charge on the data line and the gate line often causes electro-static discharge (ESD) breakdown, which causes a short circuit of the data line and the gate line, resulting in poor display.

SUMMARY

An embodiment of the disclosure provides an electro-static discharge assembly, comprising: a base substrate; a semiconductor layer, a first insulating layer, a first auxiliary electrode, a first electrode and a second electrode provided on the base substrate, wherein the first electrode and the second electrode are spaced apart from each other and are respectively in contact with the semiconductor layer, the first auxiliary electrode is in contact with one of the first electrode and the second electrode, and the first insulating layer is provided between the first auxiliary electrode and both the first electrode and the second electrode.

In some examples, the electro-static discharge assembly further comprises a second auxiliary electrode spaced apart from the first auxiliary electrode, the second auxiliary electrode being in contact with the other of the first electrode and the second electrode.

In some examples, an edge of at least one of the first auxiliary electrode, the second auxiliary electrode, the first electrode and the second electrode includes a serrated edge.

In some examples, the first electrode and the second electrode are provided in a same layer, the first electrode and the second electrode include a first edge and a second edge opposite to each other, and at least one of the first edge and the second edge includes a serrated edge.

In some examples, a portion of each of the first edge and the second edge is serrated, and in a direction in which the first edge or the second edge extends, the serrated portion of the first edge and the serrated portion of the second edge are staggered from each other.

In some examples, the first auxiliary electrode and the second auxiliary electrode are provided in a same layer, the first auxiliary electrode and the second auxiliary electrode include a third edge and a fourth edge opposite to each other, and at least one of the third edge and the fourth edge includes a serrated edge.

In some examples, a portion of each of the third edge and the fourth edge is serrated, and in a direction in which the third edge or the fourth edge extends, the serrated portion of the third edge and the serrated portion of the fourth edge are staggered from each other.

In some examples, the electro-static discharge assembly further comprises a second insulating layer, provided between the semiconductor layer and the first auxiliary electrode.

In some examples, the semiconductor layer is a polysilicon layer.

In some examples, the electro-static discharge assembly further comprises at least one of a light shielding layer and an isolation layer provided between the base substrate and the semiconductor layer, wherein a projection of the light shielding layer on the base substrate completely covers a projection of the semiconductor layer on the base substrate.

An embodiment of the disclosure provides an array substrate, comprising a display region and a non-display region, and the electro-static discharge assembly as mentioned above located in the non-display region.

In some example, the array substrate further comprises a gate line, a data line and a common electrode line, wherein the gate line or the data line is connected with the first electrode in the electro-static discharge assembly; and the common electrode line is connected with the second electrode in the electro-static discharge assembly; or, the gate line is connected with the first electrode in the electro-static discharge assembly; and the data line is connected with the second electrode in the electro-static discharge assembly.

In some examples, the first electrode and the second electrode in the electro-static discharge assembly are provided in a same layer as one of the gate line and the data line; or the display region further includes a pixel electrode, or a pixel electrode and a common electrode, and the first electrode and the second electrode in the electro-static discharge assembly are provided in a same layer as the pixel electrode or the common electrode.

In some examples, the first auxiliary electrode in the electro-static discharge assembly is provided in a same layer as the gate line or the data line.

An embodiment of the disclosure provides a fabrication method of an array substrate, comprising: forming a display structure in a display region, forming the electro-static discharge assembly as mentioned above in a non-display region.

In some examples, the electro-static discharge assembly and the display structure are formed synchronously.

In some examples, the display structure includes a gate electrode, a gate line, a source electrode, a drain electrode, a data line and a pixel electrode; the first electrode and the second electrode are formed by a same patterning process with the gate electrode and the gate line; or, the first electrode and the second electrode are formed by a same patterning process with the source electrode, the drain electrode and the data line; or the first electrode and the second electrode are formed by a same patterning process with the pixel electrode.

In some examples, the display structure includes a common electrode; the first electrode and the second electrode are formed by a same patterning process with the common electrode.

In some examples, the display structure includes a gate electrode, a gate line, a source electrode, a drain electrode and a data line; the first auxiliary electrode and a second auxiliary electrode are formed by a same patterning process with the gate electrode and the gate line; or, the first auxiliary electrode and the second auxiliary electrode are formed by a same patterning process with the source electrode, the drain electrode and the data line.

An embodiment of the disclosure provides a display device, comprising the array substrate as mentioned above.

The electro-static discharge assembly according to the embodiments of the present disclosure can improve the ability of the electro-static discharge assembly to resist ESD.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just part of but not all of the embodiments of the present disclosure. Based on the described embodiments herein, those skilled in the art can obtain other embodiment(s), without any inventive work, which should be within the scope of the present disclosure.

Figure 1A:
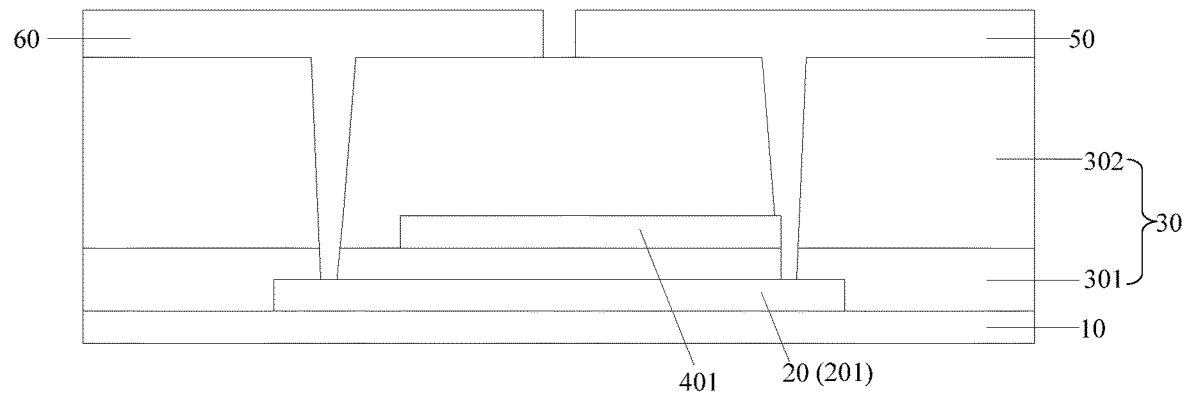
FIG. 1(a) is a structural schematic Diagram I of an electro-static discharge assembly provided by an embodiment of the present disclosure.
Figure 1B:
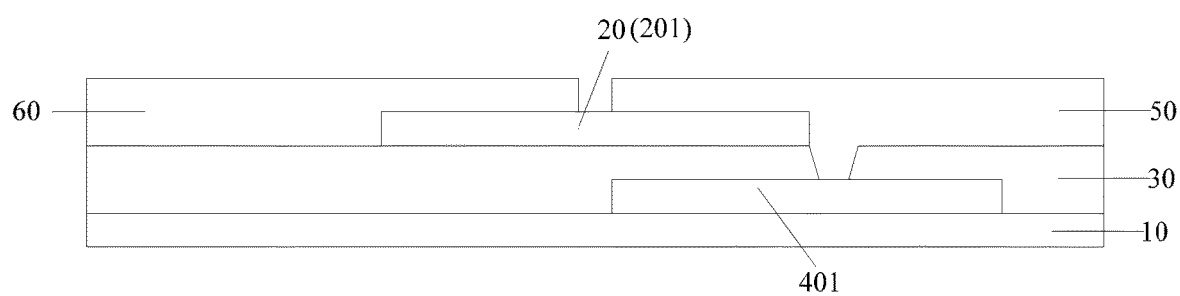
FIG. 1(b) is a structural schematic Diagram II of an electro-static discharge assembly provided by an embodiment of the present disclosure.
Figure 1C:
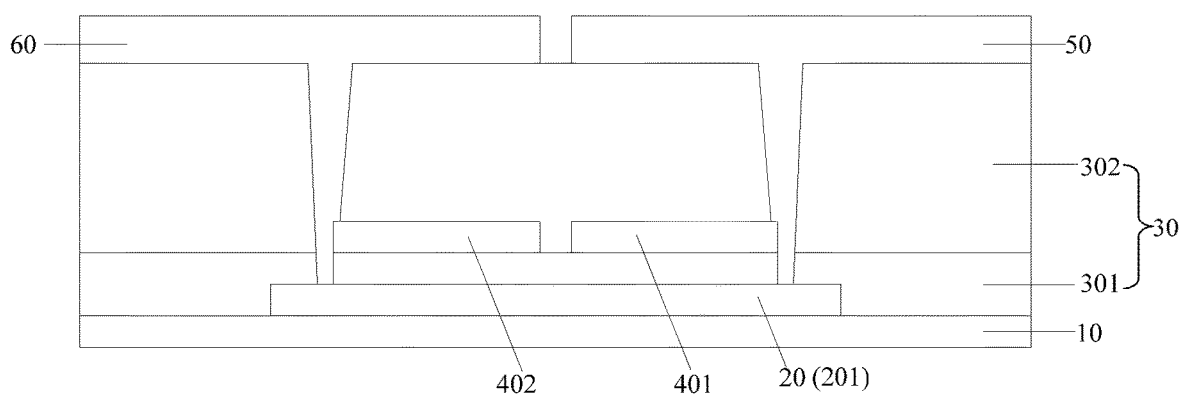
FIG. 1(c) is a structural schematic Diagram III of an electro-static discharge assembly provided by an embodiment of the present disclosure.
Figure 1D:
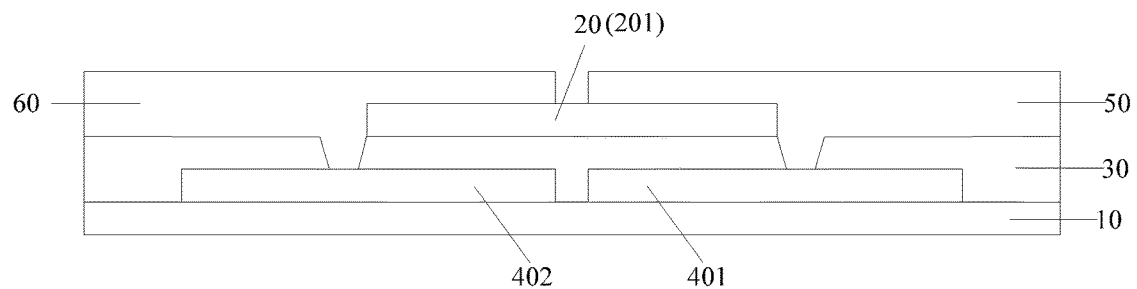
FIG. 1(d) is a structural schematic Diagram IV of an electro-static discharge assembly provided by an embodiment of the present disclosure.

An embodiment of the present disclosure provides an electro-static discharge assembly, as illustrated in FIG. 1(a) and FIG. 1(b), comprising a semiconductor layer 20, an insulating layer 30, a first auxiliary electrode 401, a first electrode 50 and a second electrode 60 provided on a base substrate 10, the first electrode 50 and the second electrode 60 being provided opposite to each other (for example, the first electrode 50 and the second electrode 60 are spaced apart from each other). The first electrode 50 and the second electrode 60 are both in contact with the semiconductor layer 20; the first electrode 50 or the second electrode 60 is in contact with the first auxiliary electrode 401; the insulating layer 30 is provided between the first auxiliary electrode 401, the semiconductor layer 20 as well as the first electrode 50 and the second electrode 60 for isolation.

It should be noted that the electro-static discharge assembly according to the embodiment of the present disclosure may be used in any electronic apparatus for electro-static discharge; for example, an array substrate of a display, an integrated circuit, and the like.

A principle for the electro-static discharge assembly according to the embodiment of the present disclosure to perform electro-static discharge is that: since the first electrode 50 and the second electrode 60 are both in contact with the semiconductor layer 20, when the electro-static discharge assembly is used for electro-static discharge, a conductive channel may be formed between the first electrode 50, the semiconductor layer 20 and the second electrode 60, and the semiconductor layer 20 has a special performance that with increase of the electro-static voltage of the line on the first electrode 50 and the first auxiliary electrode 401, an electric field intensity of the first auxiliary electrode 401 with respect to the semiconductor layer 20 also increases relatively, so that the semiconductor layer 20 generates an antiphase charge to form a channel, which facilitates flow of an electro-static current. At this time, the semiconductor layer 20 is equivalent to a small resistor, and the conductive channel may perform electro-static discharge and neutralization on the charge. Further, when the electro-static voltage is higher, the channel of the semiconductor layer 20 is equivalent to a low resistor, so as to perform electro-static discharge and neutralization with a large current on the high electro-static voltage.

For example, when the above-described electro-static discharge assembly is used in the array substrate, it may be used for solving static electricity generated by the data line or the gate line. Exemplarily, the data line is connected with the first electrode 50 in the electro-static discharge assembly, and a common electrode line is connected with the second electrode 60 in the electro-static discharge assembly; when an electro-static voltage generated on the data line is relatively small (for example, <50V), a current on the data line may flow through the first electrode 50 and the semiconductor layer 20 to the common electrode line, so that the small current on the data line is gradually discharged and neutralized; as the electro-static voltage generated on the data line gradually increases (for example, 50V to 300V), the semiconductor layer 20 has a reduced resistance under an action of a high voltage, so the electro-static current generated on the data line may flow rapidly through the first electrode 50 and the semiconductor layer 20 to the common electrode line, so that the large current on the data line is discharged and neutralized; when the electro-static voltage generated on the data line is relatively large (300V to 1KV), on the one hand, the semiconductor layer 20 has a reduced resistance under the action of the high voltage, so the electro-static current on the data line may rapidly flow through the first electrode 50 and the semiconductor layer 20 to the common electrode line, so that the current on the data line is rapidly discharged and neutralized, in addition, since the first electrode 50 and the second electrode 60 are provided opposite to each other, when the voltage on the data line is relatively large, the first electrode 50 and the second electrode 60 may also perform discharge and neutralization on the current on the data line; on the other hand, since the first electrode 50 or the second electrode 60 is also connected with the first auxiliary electrode 401, the current on the data line may also be discharged and neutralized by the first auxiliary electrode 401.

Specific positions for providing the semiconductor layer 20, the first auxiliary electrode 40, the first electrode 50 and the second electrode 60 in the electro-static discharge assembly are not limited, as long as the first electrode 50 and the second electrode 60 are both in contact with the semiconductor layer 20. For example, as illustrated in FIG. 1(*a*) or FIG. 1(*c*), the semiconductor layer 20, the insulating layer 30, the first auxiliary electrode 401 as well as the first electrode 50 and the second electrode 60 may be sequentially formed on the base substrate 10. In other examples, as illustrated in FIG. 1(*b*), the first auxiliary electrode 401, the insulating layer 30, the semiconductor layer 20 as well as the first electrode 50 and the second electrode 60 are sequentially formed on the base substrate 10.

For example, the first auxiliary electrode 401 may be in contact with the first electrode 50 or the second electrode 60 through a via hole in the insulating layer 30.

Here, the first auxiliary electrode 401 is provided between the first electrode 50, the second electrode 60 and the semiconductor layer 20, since the first auxiliary electrode 401 is in contact with the first electrode 50 or the second electrode 60, and the first electrode 50 and the second electrode 60 are in contact with the semiconductor layer 20, that is, it is equivalent to that the first auxiliary electrode 401 is in contact with the semiconductor layer 40; and when there is a current passing through the conductive channel, since a distance between the first auxiliary electrode 401 and the semiconductor layer 20 is relatively small, the first auxiliary electrode 401 may quickly open the conductive channel in the semiconductor layer 20, so as to perform electro-static discharge and neutralization.

A material of the semiconductor layer 20 is not limited, which may be, for example, amorphous silicon, polysilicon, and the like.

A material of the insulating layer 30 is not limited, which may be, for example, an insulating material such as silicon nitride, silicon oxide or silicon oxynitride.

Materials of the first auxiliary electrode 401, the first electrode 50 and the second electrode 60 may be, for example, aluminum, tungsten, chromium, molybdenum or other metal, a metal compound, and an alloy, as long as they are electrically conductive. The materials of the first auxiliary electrode 401, the first electrode 50 and the second electrode 60 may be the same or different.

The embodiment of the present disclosure provides an electro-static discharge assembly, since the first electrode 50 and the second electrode 60 are both in contact with the semiconductor layer 20, when the electro-static discharge assembly is used for electro-static discharge, the first electrode 50, the semiconductor layer 20 and the second electrode 60 may form a conductive channel. Since a resistance of the semiconductor layer 20 decreases as a voltage increases, the electro-static discharge assembly not only may perform passive electro-static discharge, i.e., when the electro-static voltage is relatively small, the electro-static discharge assembly may perform discharge and neutralization with a small current on the electro-static voltage, but also may perform active electro-static discharge, i.e., as the electro-static voltage increases, an ability of the electro-static discharge assembly to perform discharge and neutral-ization with a large current increases. Further, since the first auxiliary electrode 401 is in contact with the first electrode 50 or the second electrode 60, when the current passing through the electro-static discharge assembly is relatively large, the first auxiliary electrode 401 may also perform discharge and neutralization on the large current, so that the electro-static discharge assembly may quickly discharge and neutralize static electricity. The electro-static discharge assembly according to the embodiment of the present disclosure may perform corresponding discharge and neutralization on static electricity at different voltages, which, thus, improves an ability of the electro-static discharge assembly to resist ESD. On this basis, the electro-static current may be discharged and neutralized by sequentially flowing through the first electrode 50, the semiconductor layer 20 and the second electrode 60, and may also be discharged and neutralized by sequentially flowing through the second electrode 60, the semiconductor layer 20 and the first electrode 50, so the electro-static discharge assembly may also perform reciprocal two-way flow.

For example, as illustrated in FIG. 1(*c*) and FIG. 1(*d*), the above-described electro-static discharge assembly further comprises a second auxiliary electrode 402 provided opposed to and insulated from the first auxiliary electrode 401. For example, the first auxiliary electrode 401 and the second auxiliary electrode 402 are spaced apart from each other.

Materials of the second auxiliary electrode 402 and the first auxiliary electrode 401 may be the same or different. The material of the second auxiliary electrode 402 may be, for example, aluminum, tungsten, chromium, molybdenum or other metal, a metal compound, and an alloy. The second auxiliary electrode 402 may be in contact with the second electrode 60 through a via hole in the insulating layer 30.

In the embodiment of the present disclosure, when a current passing through the electro-static discharge assembly is relatively large, both the first auxiliary electrode 401 and the second auxiliary electrode 402 may perform instantaneous discharge and neutralization with the large current, so that the electro-static discharge assembly may quickly discharge and neutralize static electricity, which improves an ability of the electro-static discharge assembly to perform electro-static discharge and neutralization with the large current.

Figure 2A:
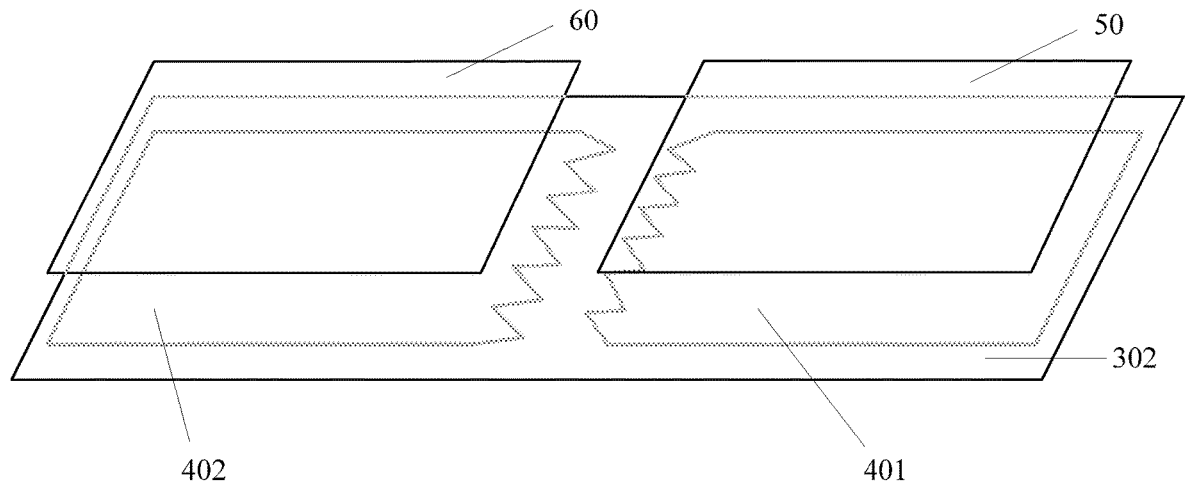
FIG. 2(a) is a top-view structural schematic diagram of a first auxiliary electrode and a second auxiliary electrode including a serrated tip in an electro-static discharge assembly provided by an embodiment of the present disclosure.
Figure 2B:
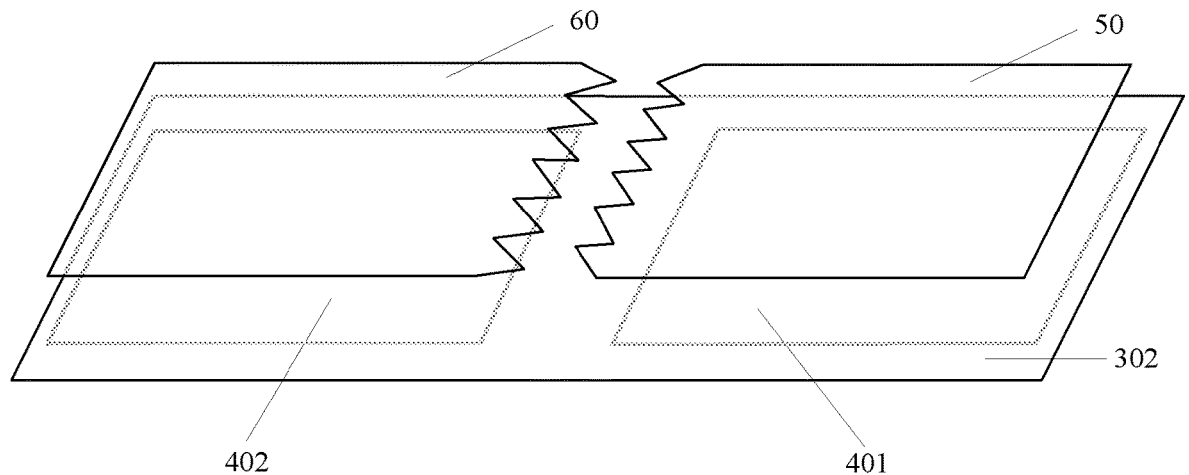
FIG. 2(b) is a top-view structural schematic diagram of a first electrode and a second electrode including a serrated tip in an electro-static discharge assembly provided by an embodiment of the present disclosure.
Figure 2C:
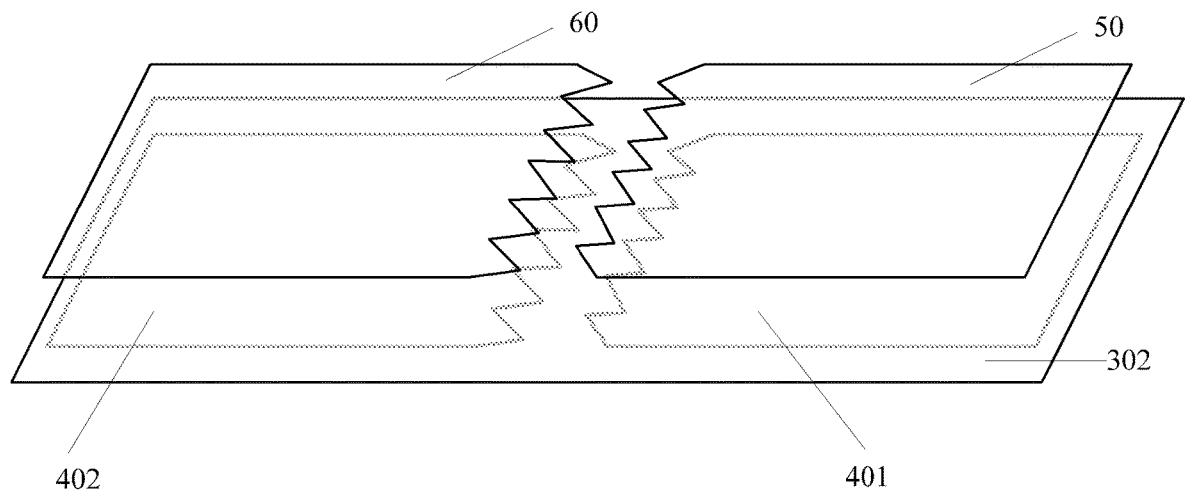
FIG. 2(c) is a top-view structural schematic diagram of a first auxiliary electrode, a second auxiliary electrode, a first electrode and a second electrode all including a serrated tip in an electro-static discharge assembly provided by an embodiment of the present disclosure.
Figure 3:
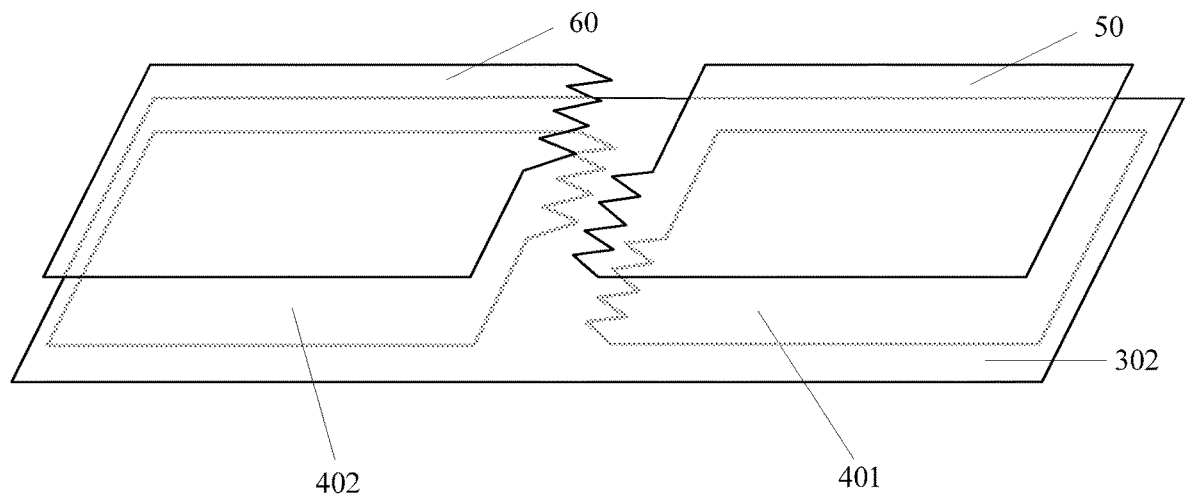
FIG. 3 is a top-view structural schematic diagram of a part of each of a first auxiliary electrode, a second auxiliary electrode, a first electrode and a second electrode all including a serrated tip in an electro-static discharge assembly provided by an embodiment of the present disclosure.

For example, as illustrated in FIG. 2(*a*), FIG. 2(*b*), FIG. 2(*c*) or FIG. 3, the first auxiliary electrode 401 and the second auxiliary electrode 402 respectively include a serrated tip, that is to say, include a serrated edge; and/or, the first electrode 50 and the second electrode 60 respectively include a serrated tip, that is to say, include a serrated edge. For example, the first auxiliary electrode 401 and the second auxiliary electrode 402 are provided in a same layer, and opposite sides of the first auxiliary electrode 401 and the second auxiliary electrode 402 respectively include a serrated tip, and/or, the first electrodes 50 and the second electrode 60 are provided in a same layer, and opposite sides of the first electrode 50 and the second electrode 60 respectively include a serrated tip. However, the embodiment of the present disclosure is not limited thereto, and an edge of at least one of the first auxiliary electrode, the second auxiliary electrode, the first electrode and the second electrode may include a serrated edge.

It may be that, as illustrated in FIG. 2(*a*), the opposite sides of the first auxiliary electrode 401 and the second auxiliary electrode 402 respectively include a serrated tip, and the opposite sides of the first electrode 50 and the second electrode 60 do not include a serrated tip; or, it may be that, as illustrated in FIG. 2(b), the opposite sides of the first auxiliary electrode 401 and the second auxiliary electrode 402 do not include a serrated tip, and the opposite sides of the first electrode 50 and the second electrode 60 respectively include a serrated tip; or, as illustrated in FIG. 2(c), the opposite sides of the first auxiliary electrode 401 and the second auxiliary electrode 402 respectively include a serrated tip, and the opposite sides of the first electrode 50 and the second electrode 60 also respectively include a serrated tip.

Here, it should be noted that, the opposite sides of the first auxiliary electrode 401 and the second auxiliary electrode 402 may be entirely set as the serrated tip as illustrated in FIG. 2(a) and FIG. 2(c), and may also be partially set as the serrated tip as illustrated in FIG. 3. The opposite sides of the first electrode 50 and the second electrode 60 may be entirely set as the serrated tip as illustrated in FIG. 2(b), and may also be partially set as the serrated tip as illustrated in FIG. 3.

The number of serrated tips included in the first auxiliary electrode 401, the second auxiliary electrode 402, the first electrode 50 and the second electrode 60 may be set according to a maximum voltage for discharge in the electro-static discharge assembly. The more the number of serrated tips, the more rapidly the static electricity at the high voltage can be discharged.

In the embodiment of the present disclosure, the first auxiliary electrode 401 and the second auxiliary electrode 402 are provided in a same layer, and the opposite sides of the first auxiliary electrode 401 and the second auxiliary electrode 402 are respectively provided with a serrated tip, and/or, the first electrode 50 and the second electrode 60 are provided in a same layer, and the opposite sides of the first electrode 50 and the second electrode 60 are respectively provided with a serrated tip; since a tip-like shape is conducive to high-voltage instantaneous discharge, when it is necessary for the electro-static discharge assembly to perform discharge and neutralization on static electricity at the high voltage, instantaneous discharge may be performed through the serrated tips provided on the opposite sides of the first auxiliary electrode 401, the second auxiliary electrode 402, and/or, the first electrode 50 and the second electrode 60.

In some examples, spacing between the first electrode 50 and the second electrode 60 is within a range of 1 μm to 5 μm, and spacing between the first auxiliary electrode 401 and the second auxiliary electrode 402 is within a range of 1 μm to 5 μm. However, it is not specifically limited in the embodiment of the present disclosure, and the above-described spacing ranges may be adjusted according to an actual situation.

In an actual production process, since a distance between the first auxiliary electrode 401 and the second auxiliary electrode 402 is smaller, if the opposite sides of the first auxiliary electrode 401 and the second auxiliary electrode 402 are entirely set as the serrated tip, then it is easy for the serrated tip of the first auxiliary electrode 401 to be in contact with the serrated tip of the second auxiliary electrode 402, resulting in that the first auxiliary electrode 401 and the second auxiliary electrode 402 are connected together, so that a purpose of instantaneous discharge and neutralization of static electricity at the high voltage cannot be achieved, when the above-described electro-static discharge assembly is at the high voltage; and similarly, if the opposite sides of the first electrode 50 and the second electrode 60 are entirely set as the serrated tip, then it is easy for the serrated tip of the first electrode 50 to be in contact with the serrated tip of the second electrode 60, resulting in that the first electrode 50 and the second electrode 60 are connected together, so that a purpose of instantaneous discharge and neutralization of static electricity at the high voltage cannot be achieved, when the above-described electro-static discharge assembly is at the high voltage.

Based on the above, in some examples, as illustrated in FIG. 3, the tips on the first auxiliary electrode 401 and the second auxiliary electrode 402 are staggered from each other (for example, they are staggered from each other in an extending direction of the corresponding serrated edge); and/or, the tip on the first electrode 50 and the tip on the second electrode 60 are staggered from each other, so that it is more conducive to tip discharge (for example, they are staggered from each other in an extending direction of the corresponding serrated edge).

It should be noted here that, the tip on the first electrode 50 and the tip on the second electrode 60 are staggered from each other refers to that the entirety of the tip on the first electrode 50 and the entirety of the tip on the second electrode 60 are staggered from each other; and the tips on the first auxiliary electrode 401 and the second auxiliary electrode 402 are staggered from each other refers to that the entirety of the tip on the first auxiliary electrode 401 and the entirety of the tip on the second auxiliary electrode 402 are staggered from each other.

Based on the above, due to advantages of a high mobility, a high response rate, and the like of polysilicon, and that polysilicon may be fabricated at a low temperature, in some examples, as illustrated in FIG. 1(a), the semiconductor layer 20 is a polysilicon layer 201, and on this basis, the insulating layer 30 includes a first sub-insulating layer 301 and a second sub-insulating layer 302, the first sub-insulating layer 301 being provided between the polysilicon layer 201 and the first auxiliary electrode 401, and the second sub-insulating layer 302 being provided between the first sub-auxiliary electrode 401 and the first electrode 50 and the second electrode 60.

A fabrication process of the polysilicon layer 201 may be, for example, depositing a layer of amorphous silicon (a-Si) on the base substrate 10, performing crystallization by using excimer laser annealing (ELA) or solid phase crystallization (SPC), so as to form the polysilicon layer 201. Of course, the polysilicon layer 201 may also be formed directly.

Materials of the second sub-insulating layer 302 and the first sub-insulating layer 301 may be the same, or may be different.

In the embodiment of the present disclosure, the semiconductor layer 20 is set as the polysilicon layer 201; and since polysilicon has a high mobility and a high response speed, the electro-static discharge assembly according to the embodiment of the present disclosure is able to rapidly discharge static electricity.

Figure 4:
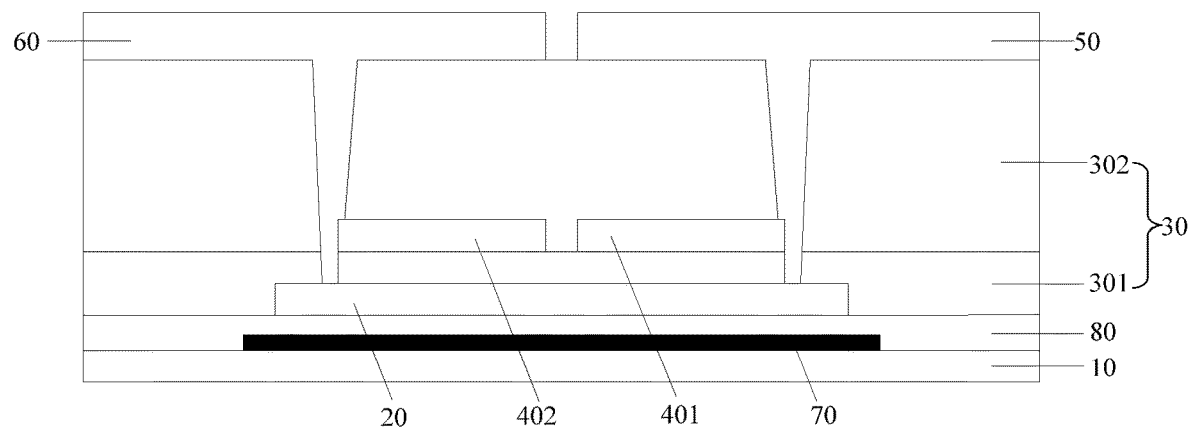
FIG. 4 is a structural schematic Diagram V of an electro-static discharge assembly provided by an embodiment of the present disclosure.

In some examples, since lighting may affect a leakage current of the semiconductor layer 20, in order to avoid the lighting from affecting the electro-static discharge assembly, as illustrated in FIG. 4, the above-described electro-static discharge assembly further comprises a light shielding layer 70 and an isolation layer 80 provided on a side of the base substrate 10 close to the semiconductor layer 20; a projection of the light shielding layer 70 on the base substrate 10 completely covers a projection of the semiconductor layer 20 on the base substrate 10.

A material of the light shielding layer 70 may be, for example, an ink, a resin polymer, a metal, and the like, as long as it is able to shield light. A material of the isolation layer 80 may be an insulating material, such as silicon nitride, silicon oxide or silicon oxynitride.

In the embodiment of the present disclosure, the light shielding layer 70 is provided and the projection of the light shielding layer 70 on the base substrate 10 completely covers the projection of the semiconductor layer 20 on the base substrate 10, so that it is possible to avoid the lighting from affecting the semiconductor layer 20, and further avoid an impact on the electro-static discharge assembly.

An embodiment of the present disclosure provides an array substrate, comprising a display region and a non-display region, the non-display region including a plurality of the electro-static discharge assemblies as described above.

The display region includes a gate line, a data line, and sub-pixels defined by the gate line and the data line intersecting with each other, each sub-pixel including a thin film transistor, the thin film transistor including a gate electrode, an insulating layer, a semiconductor layer, a source electrode and a drain electrode. When the array substrate is an array substrate of a liquid crystal display (LCD), each sub-pixel further includes a pixel electrode, and may further include a common electrode and a common electrode line. When the array substrate is an array substrate of an organic light-emitting diode (OLED) display, each sub-pixel further includes an anode, an organic material functional layer, and a cathode.

Figure 5:
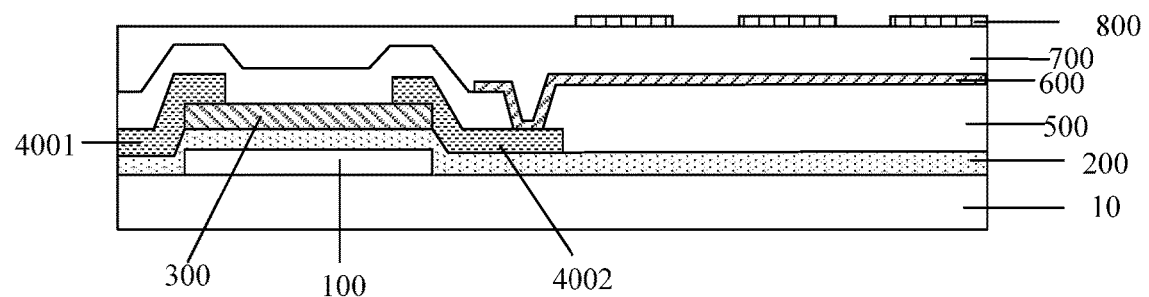
FIG. 5 is a partial cross-sectional schematic diagram of a display region of an array substrate provided by an embodiment of the present disclosure.

FIG. 5 illustrates a partial cross-sectional schematic diagram of a display region of an array substrate provided by an embodiment of the present disclosure. As illustrated in FIG. 5, the display region includes a gate electrode 100, a gate insulating layer 200, an active layer 300, a source electrode 4001, a drain electrode 4002, a passivation layer 500, a pixel electrode layer 600, a planarization layer 700 and a pixel electrode 800 formed on a base substrate 10. In addition, the array substrate further comprises a gate line formed integrally with the gate electrode 100 and a data line formed integrally with the source electrode 4001. The structure illustrated in FIG. 5 is merely an exemplary structure, and the embodiment of the present disclosure is not limited thereto. Respective layers within the display region and respective layers in the electro-static discharge assembly within the non-display region may be formed in a same patterning process to simplify the process, which will be described in more detail below.

It should be noted that, with respect to the number of electro-static discharge assemblies, it may be reasonably set according to the number of data lines and the number of gate electrodes required for electro-static discharge in the array substrate.

The embodiment of the present disclosure provides the array substrate, wherein, the non-display region is provided with a plurality of the electro-static discharge assemblies, since each electro-static discharge assembly may perform corresponding discharge and neutralization on static electricity at a low voltage, static electricity at a middle voltage or static electricity at a high voltage on the gate line and the data line connected therewith, so an ability of the array substrate to resist ESD is improved, to prevent the array substrate from being damaged.

In some examples, the display region includes the gate line, the data line and the common electrode line, wherein, the gate line or the data line is connected with the first electrode 50 in the electro-static discharge assembly; and the common electrode line is connected with the second electrode 60 in the electro-static discharge assembly.

Alternatively, the gate line is connected with the first electrode 50 in the electro-static discharge assembly; and the data line is connected with the second electrode 60 in the electro-static discharge assembly.

In this way, an electro-static voltage on the gate electrode and/or the data line may be discharged and neutralized.

It should be noted that, the gate line or the data line according to the embodiment of the present disclosure is connected with the first electrode 50 in the electro-static discharge assembly, and it may be that only the gate line is connected with the first electrode 50 in the electro-static discharge assembly, for discharging the electro-static voltage on the gate line; alternatively, only the data line is connected with the first electrode 50 in the electro-static discharge assembly, for discharging the electro-static voltage on the data line; and of course, it may also be that, both the gate line and the data line are connected with the first electrode 50 in different electro-static discharge assemblies, and at this time, the gate line and the data line are connected with different electro-static discharge assemblies, for discharging the electro-static voltage on the gate line and the data line.

In the embodiment of the present disclosure, if the first auxiliary electrode 401 is in contact with the first electrode 50, since the first electrode 50 is in contact with the semiconductor layer 20, no matter whether the gate line, or the data line, or the common electrode line is connected with the first electrode 50, it is equivalent to that, it is connected with the first auxiliary electrode 401 which is also in contact with the first electrode 50, so that during discharge with a large current, a charge on the gate line or the data line or the common electrode may be discharged either through the first electrode or through the first auxiliary electrode; similarly, if the second auxiliary electrode 402 is in contact with the second electrode 60, since the second electrode 60 is in contact with the semiconductor layer 20, no matter whether the gate line, or the data line, or the common electrode line is connected with the second electrode 60, it is equivalent to that, it is connected with the second auxiliary electrode 402 which is also in contact with the second electrode 60.

Here, it should be noted that the gate line or the data line may only be connected with one of the first electrode 50 or the first auxiliary electrode 401 in contact with the first electrode 50; and if one gate line is connected with the first electrode 50, the other gate line is connected with the first auxiliary electrode 401 in contact with the first electrode 50 in the electro-static discharge assembly, then it renders a short circuit between the two gate lines; alternatively, if one gate line is connected with the first electrode 50, and one data line is connected with the first auxiliary electrode 401 in contact with the first electrode 50 in the electro-static discharge assembly, then it renders a short circuit between the gate line and the data line. It can be understood that, respective common electrode lines are usually connected with a constant potential, e.g., a ground or a zero potential, so at a same time when one common electrode line is connected with the first electrode 50, the other common electrode line may be connected with the first auxiliary electrode 401. Connection between the second electrode 60 and the second auxiliary electrode 402 is similar to that between the first electrode 50 and the first auxiliary electrode 401, which will not be repeated here.

When it is necessary to discharge and neutralize static electricity on the gate line and the data line in the array substrate, the gate line and the data line may be connected with first electrodes 50 in different electro-static discharge assemblies, and the common electrode line is connected with the second electrode 60 in the electro-static discharge assembly. At this time, the number of electro-static discharge assemblies in the array substrate is at least larger than or equal to a sum of the number of gate lines and the number of data lines. Alternatively, the gate line may be connected with the second electrode 60 in the electro-static discharge assembly, the data line may be connected with the first electrode 50 in the electro-static discharge assembly, and at this time, the number of electro-static discharge assemblies in the array substrate should be at least smaller than the larger number among the number of gate lines and the number of data lines. Here, it should be noted that, if the number of data lines and the number of gate lines are not equal, after the data lines and the gate lines are connected with each other one by one correspondingly through the electro-static discharge assemblies, remaining gate lines or remaining data lines may discharge the voltage on the remaining data lines and the remaining gate lines through the common electrode line.

In some examples, the first electrode 50 and the second electrode 60 in the electro-static discharge assembly are provided in a same layer as the gate line; alternatively, the first electrode 50 and the second electrode 60 in the electro-static discharge assembly are provided in a same layer as the data line; alternatively, with respect to a liquid crystal display device, for example, the display region further includes a pixel electrode and a common electrode, and the first electrode 50 and the second electrode 60 in the electro-static discharge assembly are provided in a same layer as the pixel electrode or the common electrode. For example, with respect to an organic electroluminesence display device, the first electrode 50 and the second electrode 60 in the electro-static discharge assembly may also be provided in a same layer as the anode.

For example, the first electrode 50 and the second electrode 60 in the electro-static discharge assembly as well as the gate line are formed by a same patterning process, or the first electrode 50 and the second electrode 60 in the electro-static discharge assembly as well as the data line are formed by a same patterning process, or the first electrode 50 and the second electrode 60 in the electro-static discharge assembly as well as the pixel electrode or the common electrode are formed by a same patterning process.

In the embodiment of the present disclosure, since the gate line is provided in the same layer as the first electrode 50 and the second electrode 60 in the electro-static discharge assembly, it is possible to fabricate the first electrode 50 and the second electrode 60 in the electro-static discharge assembly, at a same time when fabricating the gate line on the array substrate by using a conventional process; or, the data line is provided in the same layer as the first electrode 50 and the second electrode 60 in the electro-static discharge assembly, it is possible to fabricate the first electrode 50 and the second electrode 60 in the electro-static discharge assembly, at a same time when fabricating the data line on the array substrate; or, the first electrode 50 and the second electrode 60 in the electro-static discharge assembly are provided in the same layer as the pixel electrode or the common electrode, so that it is possible to fabricate the first electrode 50 and the second electrode 60 at a same time when fabricating the pixel electrode or the common electrode by using a conventional process, and thus, the fabrication process of the electro-static discharge assembly is simplified, without adding a new film layer and a fabrication process.

In some examples, the first auxiliary electrode 401 and the second auxiliary electrode 402 in the above-described electro-static discharge assembly are provided in the same layer as the gate line or the data line. That is, the first auxiliary electrode 401 and the second auxiliary electrode 402 in the electro-static discharge assembly as well as the gate line are formed by a same patterning process, or the first auxiliary electrode 401 and the second auxiliary electrode 402 in the electro-static discharge assembly as well as the data line are formed by a same patterning process.

In the embodiment of the present disclosure, the first auxiliary electrode 401 and the second auxiliary electrode 402 in the electro-static discharge assembly may be fabricated at a same time when fabricating the gate line or the data line on the array substrate by using a conventional process, and thus, the fabrication process of the electro-static discharge assembly is simplified, without adding a new film layer and a fabrication process.

An embodiment of the present disclosure provides a fabrication method of an array substrate, comprising: forming a display structure in a display region, forming the above-described electro-static discharge assembly in a non-display region; and forming the electro-static discharge assembly and the display structure synchronously.

The display structure may include a gate electrode, a gate line, a common electrode line, a source electrode, a drain electrode, a data line, a pixel electrode, and further may include a common electrode, and the like. Here, which structure in the display structure is formed with a certain structure, for example, the first electrode 50, in the electro-static discharge assembly synchronously is not limited.

In the embodiment of the present disclosure, since the electro-static discharge assembly and the display structure are formed synchronously, it is possible to form the electro-static discharge assembly at a same time when forming the display structure, which simplifies a fabrication process of the array substrate, without adding an additional process.

Alternatively, the first electrode 50 and the second electrode 60 are formed by a same patterning process with the gate electrode and the gate line; or, the first electrode 50 and the second electrode 60 are formed by a same patterning process with the source electrode, the drain electrode as well as the data line; or, the first electrode 50 and the second electrode 60 are formed by a same patterning process with the pixel electrode; or, the first electrode 50 and the second electrode 60 are formed by a same patterning process with the common electrode.

In the embodiment of the present disclosure, by using a conventional process, the first electrode 50 and the second electrode 60 are formed at a same time when forming the source electrode, the drain electrode as well as the data line; or the first electrode 50 and the second electrode 60 are formed at a same time when forming the pixel electrode; or, the first electrode 50 and the second electrode 60 are formed at a same time when forming the gate electrode and the gate line; or, the first electrode 50 and the second electrode 60 are formed at a same time when forming the common electrode, so that the fabrication process of the array substrate is simplified, without adding an additional process.

Alternatively, the first auxiliary electrode 401 and the second auxiliary electrode 402 are formed by a same patterning process with the gate electrode and the gate line; or, the first auxiliary electrode 401 and the second auxiliary electrode 402 are formed by a same patterning process with the source electrode, the drain electrode and the data line.

Since the first auxiliary electrode 401, the second auxiliary electrode 402, and the first electrode 50 and the second electrode 60 are formed in different layers, the first auxiliary electrode 401, the second auxiliary electrode 402, and the first electrode 50 and the second electrode 60 cannot be formed simultaneously with the gate electrode, the gate line, or simultaneously with the source electrode, the drain electrode and the data line.

In the embodiment of the present disclosure, the first auxiliary electrode 401 and the second auxiliary electrode 402 are formed at a same time when forming the gate electrode and the gate line by using the conventional process; or, the first auxiliary electrode 401 and the second auxiliary electrode 402 are formed at a same time when forming the source electrode, the drain electrode and the data line, so the fabrication process of the array substrate is simplified without adding an additional process.

An embodiment of the present disclosure further provides a display device, comprising the above-described array substrate.

The display device may be a display device of a liquid crystal display (LCD) or a display device of an organic light-emitting diode (OLED).

When the array substrate is an array substrate of the LCD, the display device further comprises a box-formed substrate to be box-formed with the array substrate; and a color filter may be provided on the array substrate, and may also be provided on the box-formed substrate.

The embodiment of the present disclosure provides the display device; since the display device comprises the above-described electro-static discharge assembly, it may perform discharge and neutralization on static electricity generated on a data line and a gate line, so as to prevent the display device from being damaged by static electricity generated on the data line and the gate line, and improve an ability of the display device to resist ESD.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201610321379.5 filed on May 16, 2016, the present disclosure of which is incorporated herein by reference in its entirety as part of the present application.

The invention claimed is:

1. An electro-static discharge assembly, comprising:
   a base substrate;
   a semiconductor layer, a first insulating layer, a first auxiliary electrode, a first electrode and a second electrode provided on the base substrate,
   wherein the first electrode and the second electrode are spaced apart from each other and are respectively directly in contact with the semiconductor layer, the first auxiliary electrode is in contact with one of the first electrode and the second electrode, and the first insulating layer is provided between the first auxiliary electrode and both the first electrode and the second electrode.

2. The electro-static discharge assembly according to claim 1, further comprising a second auxiliary electrode spaced apart from the first auxiliary electrode, the second auxiliary electrode being in contact with the other of the first electrode and the second electrode.

3. The electro-static discharge assembly according to claim 2, wherein an edge of at least one of the first auxiliary electrode, the second auxiliary electrode, the first electrode and the second electrode includes a serrated edge.

4. The electro-static discharge assembly according to claim 1, wherein the first electrode and the second electrode are provided in a same layer, the first electrode and the second electrode include a first edge and a second edge opposite to each other, and at least one of the first edge and the second edge includes a serrated edge.

5. The electro-static discharge assembly according to claim 4, wherein a portion of each of the first edge and the second edge is serrated, and in a direction in which the first edge or the second edge extends, the serrated portion of the first edge and the serrated portion of the second edge are staggered from each other.

6. The electro-static discharge assembly according to claim 2, wherein the first auxiliary electrode and the second auxiliary electrode are provided in a same layer, the first auxiliary electrode and the second auxiliary electrode include a third edge and a fourth edge opposite to each other, and at least one of the third edge and the fourth edge includes a serrated edge.

7. The electro-static discharge assembly according to claim 6, wherein a portion of each of the third edge and the fourth edge is serrated, and in a direction in which the third edge or the fourth edge extends, the serrated portion of the third edge and the serrated portion of the fourth edge are staggered from each other.

8. The electro-static discharge assembly according to claim 1, further comprising a second insulating layer, provided between the semiconductor layer and the first auxiliary electrode.

9. The electro-static discharge assembly according to claim 1, wherein the semiconductor layer is a polysilicon layer.

10. The electro-static discharge assembly according to claim 1, further comprising at least one of a light shielding layer and an isolation layer provided between the base substrate and the semiconductor layer,
    wherein a projection of the light shielding layer on the base substrate completely covers a projection of the semiconductor layer on the base substrate.

11. An array substrate, comprising a display region and a non-display region, and the electro-static discharge assembly according to claim 1 located in the non-display region.

12. The array substrate according to claim 11, further comprising a gate line, a data line and a common electrode line,
    wherein the gate line or the data line is connected with the first electrode in the electro-static discharge assembly; and the common electrode line is connected with the second electrode in the electro-static discharge assembly;
    or,
    the gate line is connected with the first electrode in the electro-static discharge assembly; and the data line is connected with the second electrode in the electro-static discharge assembly.

13. The array substrate according to claim 12, wherein the first electrode and the second electrode in the electro-static discharge assembly are provided in a same layer as one of the gate line and the data line; or
    the display region further includes a pixel electrode, or a pixel electrode and a common electrode, and the first electrode and the second electrode in the electro-static discharge assembly are provided in a same layer as the pixel electrode or the common electrode.

14. The array substrate according to claim 12, wherein the first auxiliary electrode in the electro-static discharge assembly is provided in a same layer as the gate line or the data line.

15. A fabrication method of an array substrate, comprising:

forming a display structure in a display region, forming the electro-static discharge assembly according to claim 1 in a non-display region.

16. The fabrication method according to claim 15, wherein the electro-static discharge assembly and the display structure are formed synchronously.

17. The fabrication method according to claim 15, wherein the display structure includes a gate electrode, a gate line, a source electrode, a drain electrode, a data line and a pixel electrode;
   the first electrode and the second electrode are formed by a same patterning process with the gate electrode and the gate line; or,
   the first electrode and the second electrode are formed by a same patterning process with the source electrode, the drain electrode and the data line; or
   the first electrode and the second electrode are formed by a same patterning process with the pixel electrode.

18. The fabrication method according to claim 15, wherein the display structure includes a common electrode;
   the first electrode and the second electrode are formed by a same patterning process with the common electrode.

19. The fabrication method according to claim 15, wherein the display structure includes a gate electrode, a gate line, a source electrode, a drain electrode and a data line;
   the first auxiliary electrode is formed by a same patterning process with the gate electrode and the gate line; or;
   the first auxiliary electrode is formed by a same patterning process with the source electrode, the drain electrode and the data line.

20. A display device, comprising the array substrate according to claim 11.

* * * * *